(12) United States Patent
Chen et al.

(10) Patent No.: US 8,436,317 B1
(45) Date of Patent: May 7, 2013

(54) WIEN FILTER

(75) Inventors: Zhongwei Chen, San Jose, CA (US);
Xuedong Liu, San Jose, CA (US);
Weiming Ren, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 0 days.

(21) Appl. No.: 13/292,455

(22) Filed: Nov. 9, 2011

(51) Int. Cl.
*H01J 1/50* (2006.01)
(52) U.S. Cl.
USPC .............................. 250/396 ML; 250/396 R
(58) Field of Classification Search .............. 250/396 R, 250/396 ML
See application file for complete search history.

(56) References Cited

U.S. PATENT DOCUMENTS

| 4,019,989 | A | 4/1977 | Hazewindus et al. |
| 4,658,136 | A | 4/1987 | Ohtaka et al. |
| 4,924,090 | A | 5/1990 | Wollnik et al. |
| 5,444,243 | A | 8/1995 | Kohhashi et al. |
| 5,838,004 | A | 11/1998 | Tiemeijer et al. |
| 6,452,169 | B1 | 9/2002 | Mook |
| 6,617,587 | B2 | 9/2003 | Parker et al. |
| 6,844,548 | B2 | 1/2005 | Lopez et al. |
| 7,714,287 | B1 | 5/2010 | James et al. |

OTHER PUBLICATIONS

Tian-Tong Tang, "Aberration Analysis of a Crossed-field Analyzer", Optik, pp. 51-56, 1986,Wissenschaftliche Verlagsgesellschaft mbH, Stuttgart.

*Primary Examiner* — Michael Maskell
(74) *Attorney, Agent, or Firm* — WPAT, PC; Justin King

(57) ABSTRACT

This invention provides a multi-pole type Wien filter, which acts more purely approaching its fundamentally expected performance. A 12-electrode electric device acts as an electric deflector, or acts as an electric deflector and an electric stigmator together. A cylindrical 4-coil magnetic device with a magnetic core acts as a magnetic deflector. Both can produce a dipole field while only incurring a negligibly-small 3rd order field harmonic. The magnetic core enhances the strength and more preciously regulates the distribution of the magnetic field originally generated by the coils. Then two ways to construct a Wien filter are proposed. One way is based on both of the foregoing electric and magnetic devices, and the other way is based on the foregoing electric device and a conventional magnetic deflector. The astigmatism in each of such Wien filters can be compensated by the electric stigmator of the electric device.

26 Claims, 15 Drawing Sheets

WIEN FILTER

BACKGROUND OF THE INVENTION

1. Field of the Invention

The invention relates to an electric device and/or a magnetic device, and more particularly to the design of a Wien Filter or called as ExB for all the applications, such as deflecting charged particle beam in electron microscope or separating charged particles in dependence upon mass, or energy, or moving direction thereof.

2. Description of the Prior Art

Wien filter is known for its capability to separate charged particles in dependence upon mass, or energy, or moving direction thereof. It is based on the principle that the magnetic force of a magnetic field acting on a charged particle depends on the velocity vector thereof, but the electric force of an electric field acting on a charged particle does not. If the vector directions of the electric field E, magnetic field B and the particle velocity v are perpendicular to each other and obey the right-hand rule, the electric force and magnetic force acting on the particle will be opposite to each other and perpendicular to the moving direction of the particle, thereby generating a total force as shown in Equation (1.1).

$$F = q \cdot (E - v \cdot B) \tag{1.1}$$

Furthermore, if the magnitudes of the foregoing three vectors meet a specific condition, which is called as Wien Condition and shown in Equation (1.2), the net force exerted on the particle will be zero, thereby not changing the moving of the particle. Any other particle, different from said particle in velocity vector, will receive a non-zero net force, and then will be deflected away from its original moving direction.

$$E - 0 \cdot B = 0 \tag{1.2}$$

A primary configuration of Wien filter is shown in FIG. 1, where the electron is taken as an example of charged particles. A magnetic dipole field $B_1$ and an electric dipole field $E_1$ are respectively generated by a pair of magnetic pole-pieces 1 and 2 with opposite polarities and a pair of electrodes 3 and 4 with opposite potentials. Both of the dipole fields are perpendicular to each other, and superimposed along and perpendicular to a straight optical axis which lies on Z-axis. Each magnetic pole-piece may be formed by a permanent magnet or electromagnetic magnet. For sake of simplicity, hereinafter the reference regarding a magnet is expressed by the related magnetic pole-piece thereof. In the Wien filter shown in FIG. 1, two grounded pole-pieces, which include a N pole-piece 1 and a S pole-piece 2, will generate a magnetic dipole field $B_1$ in Y direction, while two electrodes, which include an electrode 3 at +Vd potential and an electrode 4 at −Vd potential, will generate an electric dipole field $E_1$ in X direction. For the electrons moving along the Z-axis and with a same velocity $v_0$, the magnetic and electric dipole fields $B_1$ and $E_1$, which respectively exert the electric force Fe and magnetic force Fm on these particles, are set to meet Wien condition as shown in Equation (1.2).

For a particle, its velocity v is related to its mass m and kinetic energy V, as shown in Equation (1.3). Obviously, Wien Condition can be satisfied for particles having a given ratio between mass and energy and a given moving direction. Therefore a Wien filter can be operated as a mass separator for particles identical in charge and energy but with a mass range, or an energy separator for particles identical in charge and mass but with an energy spread. Besides, a Wien filter can also act as a beam separator for two charged particle beams both having particles identical in mass and charge but traveling in mutually opposite directions such as primary beam and secondary beam in SEM (for example U.S. Pat. No. 4,658,136). Furthermore, a mass separator can be used for mass analysis or as a mass filter, and analogously an energy separator for energy analysis of material or as an energy filter or called as monochromator (for example U.S. Pat. No. 5,838,004).

$$v = \sqrt{\frac{2 \cdot V}{m}} \tag{1.3}$$

For most of the applications of Wien filter, Wien filter is employed in an imaging system, wherein the straight optical axis of the Wien filter coincides with the straight optical axis of the imaging system. If the Wien condition is not satisfied wherever the particles of the imaging beam will go through, the additional aberrations will be added to the imaging beam due to the undesired particle deflection. Therefore, constraining or even eliminating the adverse impact of Wien filter on imaging quality is a prerequisite for employing a Wien filter in such a case, and meeting Wien Condition to the maximum extent possible is the essential requirement for constructing a Wien Filter in practical use. Meeting Wien condition in practice can be considered separately in the on-axis (on optical axis) and the off-axis (off optical axis) areas.

At first, in the on-axis area, the velocities of on-axis particles are constant because there is no axial acceleration or deceleration field within Wien filter. Therefore Equation (1.2) requires the on-axis electric and magnetic fields $E_1$ and $B_1$ have a same distribution shape. If it is not true, the net forces exerted on the on-axis charged particles will not be zero, thereby gradually deflecting the particles away from the optical axis and generating off-axis aberrations. The better the two fields match each other in field distribution shape, the smaller the net forces will be, thereby appearing the less off-axis aberrations. However, fundamentally the electric and magnetic fields impossibly match each other perfectly if the electrodes in the electric deflector and the magnetic pole-pieces in the magnetic deflector are not identical in geometry.

Secondly, in the off-axis area, due to a potential change in the electric field direction which is X direction in FIG. 1, any off-axis particle in the imaging beam will have a velocity not only different from the given velocity of the on-axis particles but also dependent on its off-axis shift in X direction, as shown in Equation (1.4). Fundamentally, if both of the electric and magnetic dipole fields are uniform in the electric field direction, the Wien condition can not be satisfied over the entire off-axis area, thereby leading to a focusing effect in this direction and hence adding astigmatism to the imaging particle beam.

$$v_0 - v = -\frac{e \cdot E_1 \cdot x}{m \cdot v_0} \tag{1.4}$$

A number of methods have been proposed to construct a Wien filter meeting the Wien Condition to the maximum extent possible. One way is to make the magnetic dipole field have a magnitude gradient in the electric field direction by using a pair of magnetic pole-pieces with wedge front end or hyperbolic front end such as U.S. Pat. No. 4,924,090 and U.S. Pat. No. 5,444,243, or adding a coil to the flat front end of each pole-piece such as U.S. Pat. No. 4,019,989. Another way is to use additional quadrupole field to compensate the astigmatism by using a multi-pole type Wien filter which can form a quadrupole field as well as a dipole field. The later has achieved wide acceptance because of its flexibility of matching the changeable operation conditions of the imaging systems which Wien filter will be applied to. Usually, it is realized by using an electric or/and a magnetic multi-pole device in a Wien filter, so as to act as a deflector and a stigmator simultaneously. However, when a multi-pole device is excited to generate a dipole field, it actually generates a field which not only comprises a dipole field or called as $1^{st}$ order harmonic but also many higher order harmonics which are undesired due to incurring aberrations. The first higher order harmonic is $3^{rd}$ order harmonic.

Tian-Tong Tang (Optik, 74, No. 2, 1986, P51-56) proposes an 8-pole type Wien filter in which each of eight identical magnetic pole-pieces is also used as an electrode. This arrangement fundamentally ensures a good match of magnetic and electric dipole fields in field distribution shape, and its excitation way minimizes the $3^{rd}$ order harmonics of electric and magnetic fields. Similarly, Lopez and Tsuno (U.S. Pat. No. 6,844,548) provide a Wien filter having twelve identical pole-pieces as both of magnetic pole-pieces and electrodes, which minimizes the undesired the $3^{rd}$ field harmonics by an excitation way requiring fewer power supplies than the former.

On the entrance and exit sides of a Wien filter, the distributions of the magnetic and electric dipole fields more depend on the corresponding measures for field termination. As shown in FIG. 2(a), a usual measure is putting two grounded terminating plates 7 and 8 to sandwich the electrodes (3 and 4) and magnetic pole-pieces (1 and 2) with two axial gaps 15 and 16. The terminating plates are made of a material of both electric and magnetic conductor and hence can effectively constrain the electric and magnetic fields to be between them, i.e. within the main area 10 and two near fringe areas 11 and 12. However, due to the opening on each terminating plate for particles passing through, the electric field and magnetic field can not be terminated perfectly, and will leak out to the far fringe areas 13 and 14. In addition, the electric field will weaken faster than the magnetic field. Therefore, the distribution shapes of the electric and magnetic field will be almost same in the main area 10, but have a larger difference in the near fringe areas 11 and 12 and a smaller difference in the far fringe areas 13 and 14, as shown in FIG. 2(b). Usually, the lengths of the electrodes and magnetic pole-pieces are designed to be larger than the inner diameters thereof, so that the range with a good fields-match will dominate the entire field range.

In practice, a compact design of Wien filter is also important for many applications. For example, a longer Wien filter is not useful for an energy filter used to improve imaging resolution in SEM because of incurring a larger electron interaction; a Wien filter having larger outer radial dimensions is unaccepted for a beam separator employed to improve collection of secondary electron in SEM because its desired location is inside the bore of the magnetic objective lens. A Wien filter having a shorter length but a good fields-match is proposed in U.S. Pat. No. 6,452,169, which requires the mutual distance of the electrodes and the mutual distance of the magnetic poles are larger or approximately equal to the mutual distance of the terminating plates. However its requirement limits the efficiency of the Wien filter. A Wien filter having a compact structure is used in U.S. Pat. No. 4,658,136, which comprises an electric deflector having four cylindrical identical electrodes 3, 4, 5, and 6 and a magnetic deflector having two saddle coils 1 and 2 covering the outer sidewall of the four electrodes as shown in FIG. 3, wherein the electrodes 5 and 6 are grounded and the electrodes 3 and 4 are at +Vd and −Vd potential respectively. An electric dipole field $E_1$ in X direction is then generated by the four electrodes 3, 4, 5, and 6. The two coils 1 and 2 will generate a magnetic dipole field $B_1$ in Y direction. For this structure, it is difficult to obtain a good fields-match because the magnetic field distribution depends on the coil shape which is difficult to be made accurately.

Accordingly, a new design of Wien filter, which can meet the Wien condition as much as possible and has a compact and efficient structure, is demanded by many applications, particularly for a charged particle apparatus using Wien filter in its imaging system such as a SEM.

SUMMARY OF THE INVENTION

This invention will provide a multi-pole type Wien filter, which is especially useful for the applications in an imaging system, such as acting as monochromator or beam separator in an electron microscope. Such an application requires a strict conforming to Wien Condition to minimize derivative aberrations and a compact structure. At first, two elementary devices for a Wien filter are provided, a 12-electrode electric device and a cylindrical 4-coil magnetic device, to respectively produce an electric and a magnetic dipole fields, and each device has a compact structure. Then two designs of Wien filter constructed by using one or both of the foregoing elementary devices are proposed. In both designs, the Wien filter can generate a good match of on-axis electric and magnetic dipole fields in field distribution shape, negligibly-small $3^{rd}$ order electric and magnetic field harmonics, and a desired quadrupole electric field for astigmatism compensation.

Accordingly, the present invention therefore provides an elementary electric device at first. The electric device comprises twelve electrodes. Inner ends of the twelve electrodes configure a cylindrical through hole and an 8-fold symmetry. A central axis of the cylindrical through hole is an optical axis of the electric device. Twelve through slits separate the twelve electrodes respectively and are parallel to the optical axis. Each of the twelve through slits has a central plane containing the optical axis. A $1^{st}$ electrode, a $2^{nd}$ electrode, a $3^{rd}$ electrode, a $4^{th}$ electrode, a $5^{th}$ electrode, a $6^{th}$ electrode, a $7^{th}$ electrode, an $8^{th}$ electrode, a $9^{th}$ electrode, a $10^{th}$ electrode, an $11^{th}$ electrode, and a $12^{th}$ electrode of the twelve electrodes are configured in a rotation sequence.

The 8-fold symmetry of the elementary electric device has four planes of symmetry, and each of which contains the optical axis. The first and the third planes of symmetry of the four planes of symmetry are perpendicular to each other, and the second and the fourth planes of symmetry of the four planes of symmetry are perpendicular to each other. An angle between the first and the second planes of symmetry is 45°. The first plane of symmetry bisects the inner ends of the $1^{st}$ and $7^{th}$ electrodes. The second plane of symmetry bisects the through slit between the $2^{nd}$ and $3^{rd}$ electrodes and the through slit between the $8^{th}$ and $9^{th}$ electrodes. The third plane of symmetry bisects the $4^{th}$ and $10^{th}$ electrodes. The fourth plane of symmetry bisects the through slit between the $5^{th}$ and $6^{th}$ electrodes and the through slit between the $11^{th}$ and $12^{th}$ electrodes. Total twelve electrodes are excited to generate an electric dipole field in a direction perpendicular to the optical axis.

In the elementary electric device, an angle between the first plane of symmetry and the central plane of the through slit between the $1^{st}$ and $2^{nd}$ electrodes is not 15°, but preferred to be between about 24° and about 26°, and most preferred 25°. Inner sides of the twelve through slits, in any sectional plane perpendicular to the optical axis, are preferred geometrically equal to each other. Each inner side of each of the twelve through slits, in the any sectional plane perpendicular to the optical axis, is preferred to have an equal arc angle. The arc angles of inner sides of the twelve through slits, in the any sectional plane perpendicular to the optical axis are preferred to be equal to each other and between about 2° and about 5°, and most preferred 3°.

In the elementary electric device, the $5^{th}$, $7^{th}$, and $9^{th}$ electrodes can be set at a first potential, the $1^{st}$, $3^{rd}$, and $11^{th}$ electrodes are set at a second potential, the $8^{th}$, $10^{th}$, and $12^{th}$ electrodes are set at a third potential, and the $2^{nd}$, $4^{th}$, and $6^{th}$ electrodes are set at a fourth potential. An average of the first and second potentials is equal to an average of the third and fourth potentials. The average of the first and second potentials is preferred to be equal to zero potential or called as Ground potential. Potentials of the $1^{st}$, $2^{nd}$, $6^{th}$, $7^{th}$, $8^{th}$, and $12^{th}$ electrodes can be changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

This invention therefore provides an elementary magnetic device secondly. The magnetic device comprises a cylindrical magnetic core with a cylindrical through hole and four coils. A central axis of the cylindrical through hole is an optical axis of the magnetic device. The four coils respectively wind around an inner sidewall and an outer sidewall of the magnetic core and are parallel to the optical axis of the magnetic device. A $1^{st}$ coil, a $2^{nd}$ coil, a $3^{rd}$ coil, and a $4^{th}$ coil of the four coils are configured in a rotation sequence. The $1^{st}$ and $3^{rd}$ coils are bisected by a common central plane, and the $2^{nd}$ and $4^{th}$ coils are bisected by the other common central plane. Both of the two common central planes contain the optical axis of the magnetic device. A first plane and a second plane respectively bisect two adjacent angles between the two common central planes. A first direction and a second direction are both perpendicular to the optical axis of the magnetic device and respectively parallel to the first and the second planes. The four coils are excited to generate a magnetic dipole filed in a direction perpendicular to the optical axis of the magnetic device.

In the elementary magnetic device, the cylindrical through hole can be coaxial with an outline of the cylindrical magnetic core. One of the two adjacent angles between the two common central planes is preferred to be between about 110° to about 130°, and most preferred 120°. Magnetomotive forces of the four coils are preferred equal in magnitude, and the electric current directions thereof are symmetric about the first plane and anti-symmetric about the second plane. The four coils may have an equal number of turns.

Thereafter, the present invention provides several embodiments of the multi-pole type Wien filter on the basis of one or both of the elementary electric device and the elementary magnetic device.

The present invention therefore provides a first embodiment of the Wien filter which comprises an electric device same as the elementary electric device and a magnetic device. The magnetic device includes a first magnetic pole-piece, a second magnetic pole-piece, a first coil, and a second coil. The first magnetic pole-piece and the second magnetic pole-piece include a first flat front end and a second flat front end respectively. The first coil and the second coil wind around rear parts of the first and the second magnetic pole-pieces respectively. The first and the second flat front ends are parallel and opposite to each other. The electric device is configured between the first and the second flat front ends. An optical axis of the electric device is parallel to the first flat front end, and is an optical axis of the Wien filter. A first direction and a second direction of the Wien filter are both perpendicular to the optical axis, and respectively parallel and perpendicular to the first front end. The electric device generates an electric dipole field in the first direction. The magnetic device generates a magnetic dipole field in the second direction by exciting the first and second coils to make the first and second flat front ends have opposite polarities. The first plane of symmetry of the electric device is preferred parallel to the first direction of the Wien filter.

The present invention therefore provides a second embodiment of the Wien filter which comprises a magnetic device same as the elementary magnetic device and a cylindrical electric device. The electric device includes twelve electrodes, and the twelve electrodes configure a cylinder with a coaxial-cylindrical through hole. A central axis of the through hole is an optical axis of the electric device. The twelve electrodes configure an 8-fold symmetry and are sectorial in any sectional plane perpendicular to the optical axis. Twelve through slits separate the twelve electrodes respectively and are parallel to the optical axis. Each of the twelve through slits has a central plane containing the optical axis. The twelve electrodes are excited to generate one electric dipole field in a direction perpendicular to the optical axis. The cylindrical magnetic core of the magnetic device encompasses the electric device. The optical axis of the electric device is coincident with the optical axis of the magnetic device, and is an optical axis of the Wien filter. The electric dipole field generated by the electric device is perpendicular to the magnetic dipole field generated by the magnetic device.

The present invention therefore provides a third embodiment of the Wien filter which comprises a magnetic device and an electric device respectively same as the elementary magnetic device and the elementary electric device. The electric device is inside the cylindrical through hole of the magnetic core of the magnetic device. The optical axis of the electric device is coincident with the optical axis of the magnetic device, and is an optical axis of the Wien filter. The first and second directions of the magnetic device are a first direction and a second direction of the Wien filter respectively. The electric device generates an electric dipole field in the first direction of the Wien filter, and the magnetic device generates a magnetic dipole field in the second direction of the Wien filter. An outline of the electric device is preferred to be configured to be cylindrical and coaxial with the cylindrical through hole thereof. Inner sides of twelve through slits of the electric device are preferred to have equal arc angles in any sectional plane perpendicular to the optical axis. The cylindrical magnetic core of the magnetic device and the cylindrical through hole thereof are preferred to be configured coaxial.

The first plane of symmetry in the electric device is preferred to coincide with the first plane of the magnetic device. Accordingly, in the electric device, the $5^{th}$, $7^{th}$, and $9^{th}$ electrodes can be set at a first potential, the $1^{st}$, $3^{rd}$, and $11^{th}$ electrodes are set at a second potential, the $8^{th}$, $10^{th}$, $12^{th}$, $2^{nd}$, $4^{th}$, and $6^{th}$ electrodes are set at an average of the first and second potentials. The average of the first and second potentials is preferred equal to zero potential. The potentials of the $1^{st}$, $2^{nd}$, $6^{th}$, $7^{th}$, $8^{th}$, and $12^{th}$ electrodes can be changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

In the third embodiment of the Wien filter, each of two end portions of the cylindrical through hole of the electric device is preferred to have a conical shape coaxial with the through hole, such that a distribution shape of the electric dipole field can match a distribution shape of the magnetic dipole field along the optical axis of the Wien filter.

The third embodiment of the Wien filter may further comprise two field-terminating plates, which are perpendicular to the optical axis of the Wien filter and sandwich both the magnetic device and the electric device with two axial gaps respectively, such that the electric dipole field and the magnetic dipole field along the optical axis of the Wien filter vanish away rapidly outside the Wien filter. Each of the two plates is made of a material of both electric and magnetic conductor, has an opening aligned with the optical axis of the Wien filter and for particles passing through, and is set at a potential so as not to generate acceleration or deceleration field along the optical axis within the Wien filter.

For the electric device of the third embodiment of the Wien filter, the angle between the first plane of symmetry and the central plane of the through slit between the $1^{st}$ and $2^{nd}$ electrodes is preferred about 25°, and arc angles of inner sides of the twelve through slits in the any sectional plane perpendicular to the optical axis are preferred equal to each other and between about 2° and about 5°. For the magnetic device of the third Wien filter, the angle between the two common central planes and bisected by the second plane is preferred about 120°.

The present invention therefore further provides a fourth embodiment of the Wien filter which comprises a cylindrical magnetic device and a cylindrical electric device respectively similar to the elementary magnetic device and the elementary electric device. The cylindrical magnetic device includes a cylindrical magnetic core with a first coaxial-cylindrical through hole and four coils. A central axis of the coaxial-cylindrical through hole is an optical axis of the magnetic device and the Wien filter. Four coils respectively wind around an inner sidewall and an outer sidewall of the magnetic core and parallel to the optical axis. The four coils configure a 4-fold symmetry in any sectional plane perpendicular to the optical axis such that a magnetic dipole field can be generated within the magnetic device in a direction perpendicular to the optical axis.

The cylindrical electric device of the fourth embodiment of the Wien filter includes twelve electrodes, and the twelve electrodes configure a cylinder with a second coaxial-cylindrical through hole and are inside the first through hole of the cylindrical magnetic device. A central axis of the second coaxial-cylindrical through hole is an optical axis of the electric device and coincident with the optical axis of the Wien filter. The twelve electrodes configure an 8-fold symmetry and are sectorial in any sectional plane perpendicular to the optical axis of the electric device. Twelve through slits separate the twelve electrodes respectively and are parallel to the optical axis of the electric device. Each of the twelve through slits has a central plane containing the optical axis of the electric device. The twelve electrodes are excited to generate one electric dipole field within the electric device in a direction perpendicular to the optical axis of the Wien filter and the magnetic dipole field. Each of two end portions of the coaxial-cylindrical through hole of the electric device has a conical shape coaxial with the hole, such that a distribution shape of the electric dipole field can match a distribution shape of the magnetic dipole field along the optical axis of the Wien filter.

The fourth embodiment of the Wien filter may further comprises two field-terminating plates. The two plates are configured to be perpendicular to the optical axis of the Wien filter and sandwich the magnetic device and the electric device with two axial gaps respectively, such that the electric dipole field and the magnetic dipole field along the optical axis of the Wien filter vanish away rapidly outside the Wien filter. Each of the two plates has an opening aligned with the optical axis of the Wien filter and for particles passing through, is made of a material of both electric and magnetic conductor, and set at a potential so as not to generate acceleration or deceleration field along the optical axis inside the Wien filter.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EXAMPLE EMBODIMENTS

Figure 1:
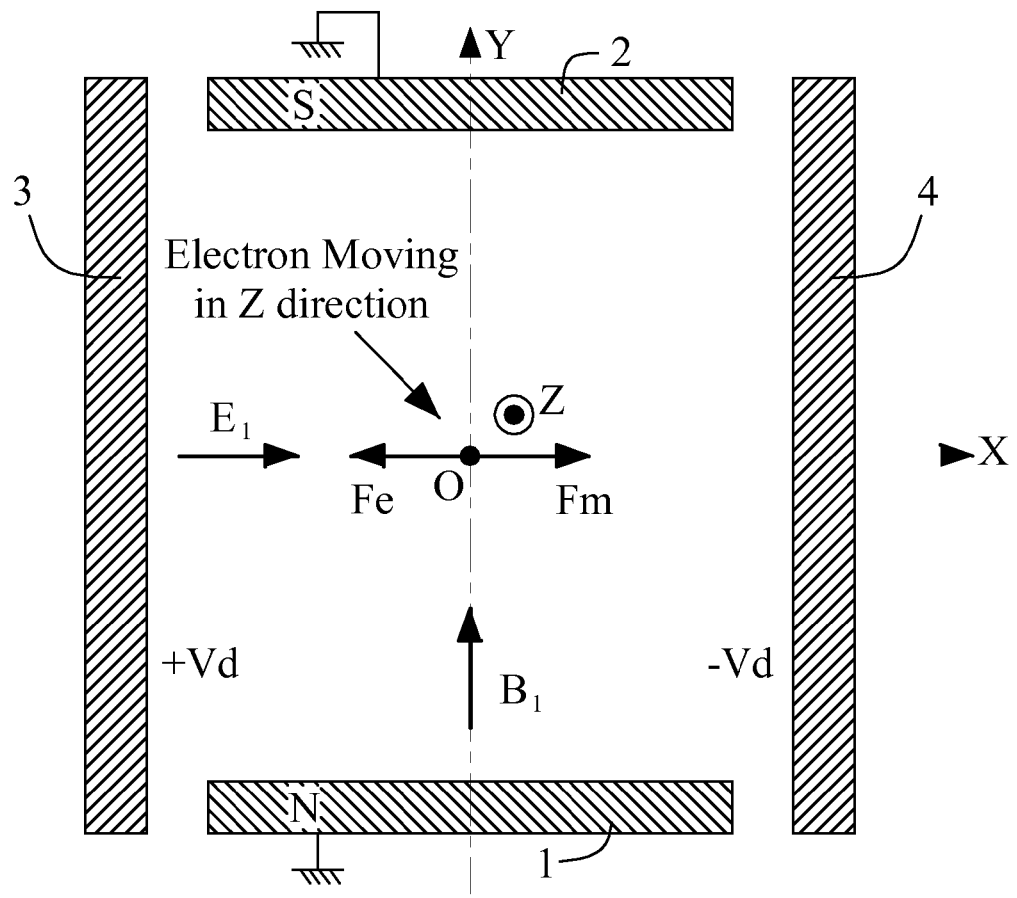
FIG. 1 is a schematic illustration of the view on a sectional plane of a conventional, fundamental Wien filter.
Figure 2A:
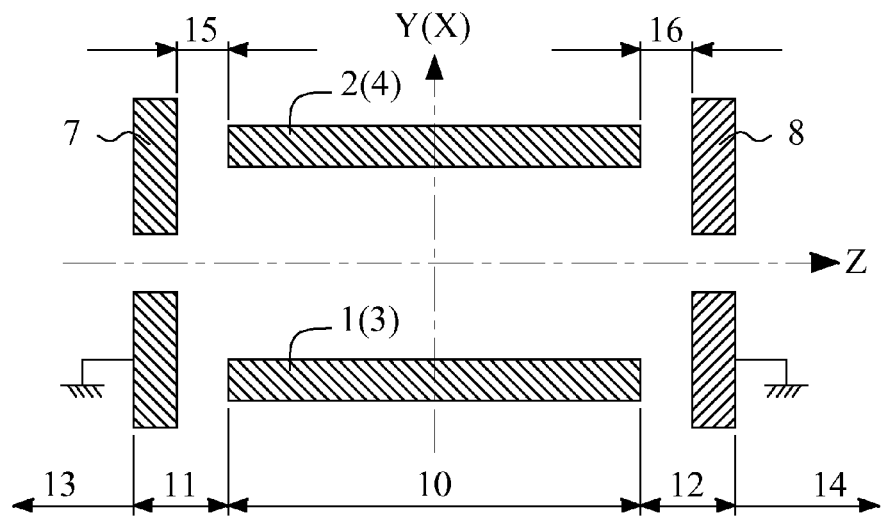
FIG. 2(a) is a schematic illustration of the view on another sectional plane of the Wien filter shown in FIG. 1.
Figure 2B:
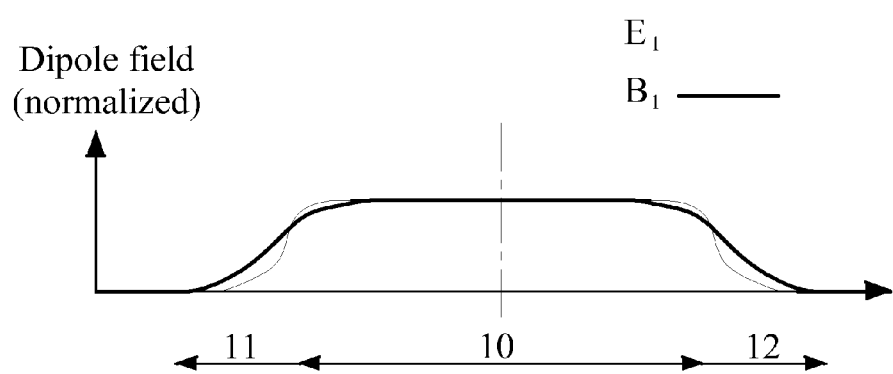
FIG. 2(b) is a schematic illustration of the distributions of the on-axis electric and magnetic dipole fields of the Wien filter shown in FIG. 1 and FIG. 2(a).
Figure 3:
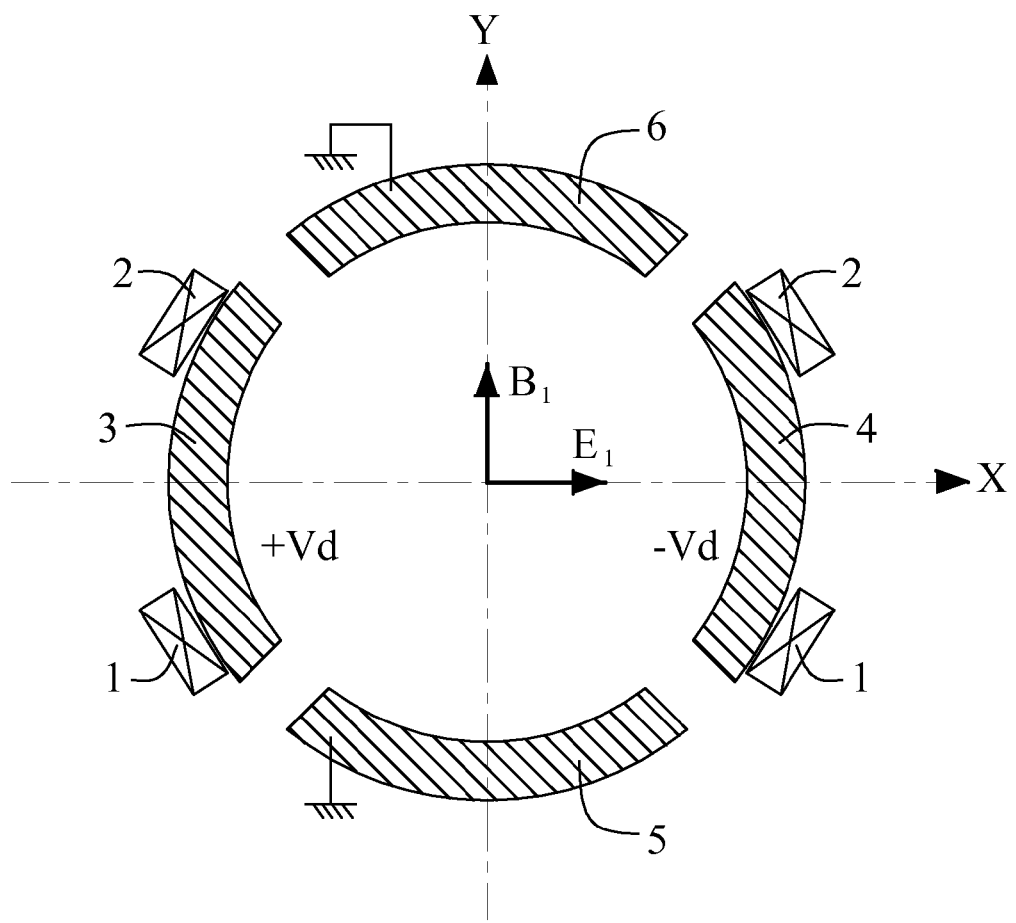
FIG. 3 is a schematic illustration of another conventional Wien filter with a compact structure.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles In the drawings, relative dimensions of each component and among every component may be exaggerated for clarity. Within the following description of the drawings the same or like reference numbers refer to the same or like components or entities, and only the differences with respect to the individual embodiments are described. In all the drawings, X, Y and Z axes form Cartesian coordinate, and the electron beam propagates along Z-axis in +Z direction.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, an 8-fold symmetry means an electric device will be symmetrical about four planes which include a first plane, a second plane, a third plane, and a four plane all containing the same axis. The first plane is orthogonal to the third plane while the second plane is orthogonal to the fourth plane, wherein an angle between the first plane and the second plane is 45°. The electric device, in this invention, includes twelve electrodes, and the twelve electrodes hence are symmetrical about the four planes.

In this invention, 4-fold symmetry means positions of four coils of a magnetic device will be symmetrical about two planes which include the first plane and the third plane mentioned above.

In this invention, "axial" means "in the optical axis direction of a Wien filter", while "radial" means "in a direction perpendicular to the optical axis of a Wien filter".

As shown in FIG. 1, a Wien filter is basically required to provide a dipole electric field $E_1$ and a dipole magnetic field $B_1$ respectively perpendicular to each other and an straight optical axis which lies on Z-axis. For functioning as an electron separator along the optical axis, Wien Condition shown in Equation (1.2) needs to be accomplished. This requires a perfect match in field distributions of electric and magnetic dipole fields along the optical axis and a perfect elimination of astigmatism.

Accordingly, a design of Wien filter is expected to satisfy the foregoing requirements as much as possible while adding no or as small as possible additional aberrations to the electron beam passing through. Furthermore, because the provision of a Wien filter increases the length of the optical column and involves additional mechanical and electrical complexity of the setup, the structure of a Wien filter is desired to be simple, compact and take a small space.

The present invention provides a design of Wien filter which can function more close to its theoretically expected performance and has a simple and compact structure. At first an elementary electric device is provided as a first embodiment of the invention, which comprises twelve electrodes and is excited to act as an electric deflector only or an electric deflector and an electric stigmator simultaneously, as shown in FIGS. 4(a)~4(f). Secondly an elementary magnetic device is proposed as a second embodiment of the invention, in which four coils are winded around a cylindrical magnetic core and excited to work as a magnetic deflector, as shown in FIGS. 5(a) and 5(b). Then several embodiments of Wien filter, which are based on one or both of the foregoing embodiments, are proposed as a third, a fourth and a fifth embodiments of the invention and shown in FIG. 6, FIGS. 7(a) and 7(b), and FIG. 8 respectively. Detailed description and mechanism of the embodiments of the present invention are described next.

Figure 4A:
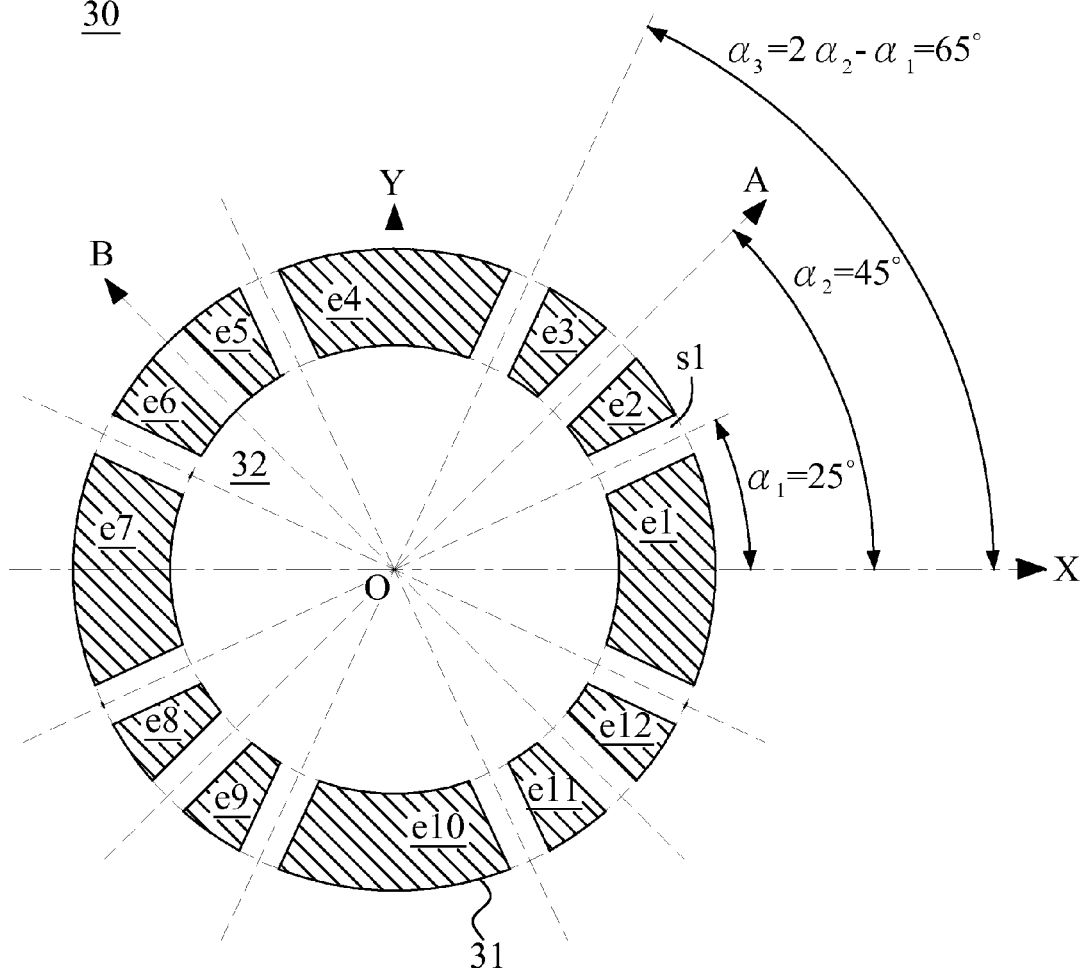
FIGS. 4(a)~4(f) are schematic illustrations of a cylindrical 12-electrode electric device and its functions in accordance with a first embodiment of the present invention.
Figure 4B:
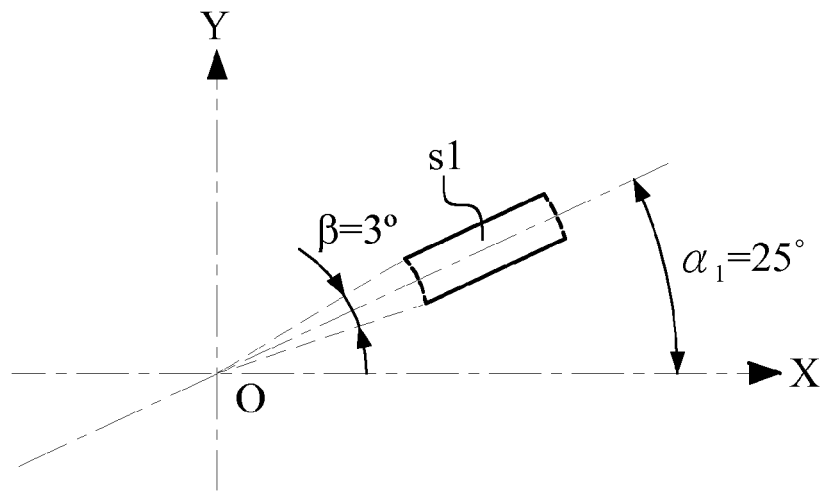
Figure 4C:
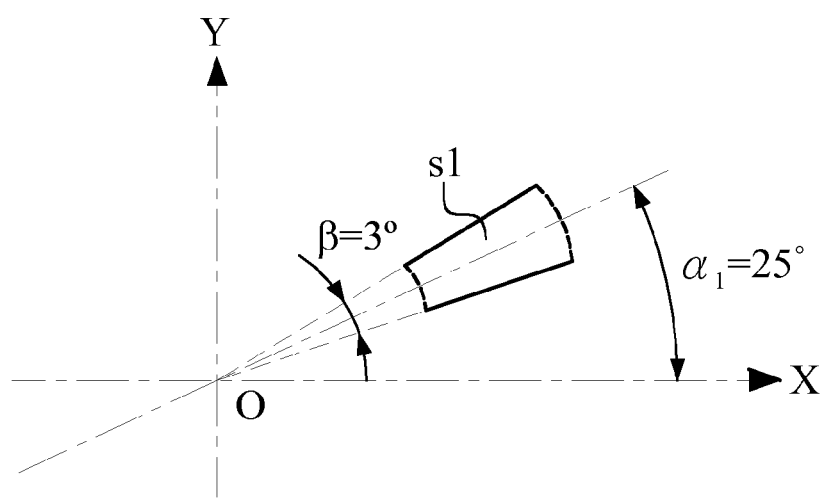

As the first embodiment of the invention, a 12-electrode electric device 30 is proposed and shown in FIGS. 4(a)~4(f). FIG. 4(a) is the view on a sectional plane perpendicular to the optical axis which lies on Z-axis. The electric device 30 comprises twelve electrodes e1~e12 named in a counter-clockwise rotation sequence. The electrode e1 is on the positive X-axis, and e1~e12 are respectively named as the $1^{st}$~$12^{th}$ electrodes. The twelve electrodes e1~e12 are separated by twelve through slits s1~s12, respectively between every two adjacent electrodes and named in the rotation sequence with respective to electrodes e1~e12 (here only the $1^{st}$ through slit s1 between the electrodes e1 and e2 is indicated for the sake of clarity). The inner ends of the twelve electrodes e1~e12 form a cylindrical through hole 32 and an 8-fold symmetry about four planes XOZ, YOZ, AOZ and BOZ. The plane AOZ is orthogonal to the plane BOZ, and forms an angle equal to 45° with respect to the plane XOZ. The plane XOZ bisects the inner ends of electrodes e1 and e7, the plane YOZ bisects the inner ends of electrodes e4 and e10, the plane AOZ bisects the through slit s2 between the electrodes e2 and e3 and the through slit s8 between the electrodes e8 and e9, and the plane BOZ bisects the through slit s5 between the electrodes e5 and e6 and the through slit s11 between the electrodes e11 and e12. The outer ends of the twelve electrodes are configured to form a cylindrical shape in FIG. 4(a) for the sake of simplicity in drawing, but it can be other shapes. In such a way, the twelve electrodes e1-e12 form a cylinder 31 with the cylindrical through hole 32 and the twelve through slits s1-s12. The central axis of the through hole 32 coincides with Z-axis and is called as the central axis and optical axis of device 30. Arc angles of inner sides of the through slits s1-s12 are equal to each other. Each of the through slits s1-s12 has a central plane containing the Z-axis. For the sake of clarity, the $1^{st}$ electrode e1 is used to define the orientation of the electric device in the following description.

In FIG. 4(a), the position of each through slit is expressed by the azimuth a of its central line with respect to X-axis and origin O. The azimuths $\alpha_1$~$\alpha_3$ of the $1^{st}$~$3^{rd}$ through slits s1~s3 have a relationship shown in Equation (2.1), where $\alpha_2$ is equal to 45°. The azimuth $\alpha_1$ is not 15°, but preferred between about 24° to 26°, and most preferred equal to 25°. Each through slit can be rectangular or sectoral in the sectional plane, as the $1^{st}$ through slit s1 respectively shown in FIG. 4(b) and FIG. 4(c), and its angular width is expressed by the circumferential angle or called as arc angle β of its inner arc side with respect to the origin O. The angle β is preferred between about 2° to 5°, and most preferred equal to 3°. The azimuth α and arc angle β of each through slit are constant in any sectional plane perpendicular to the optical axis on Z-axis. FIG. 4(f) shows the electric device 30 in a three-dimensional drawing.

$$\alpha_3 = 2\cdot\alpha_2 - \alpha_1 \qquad (2.1)$$

Figure 4D:
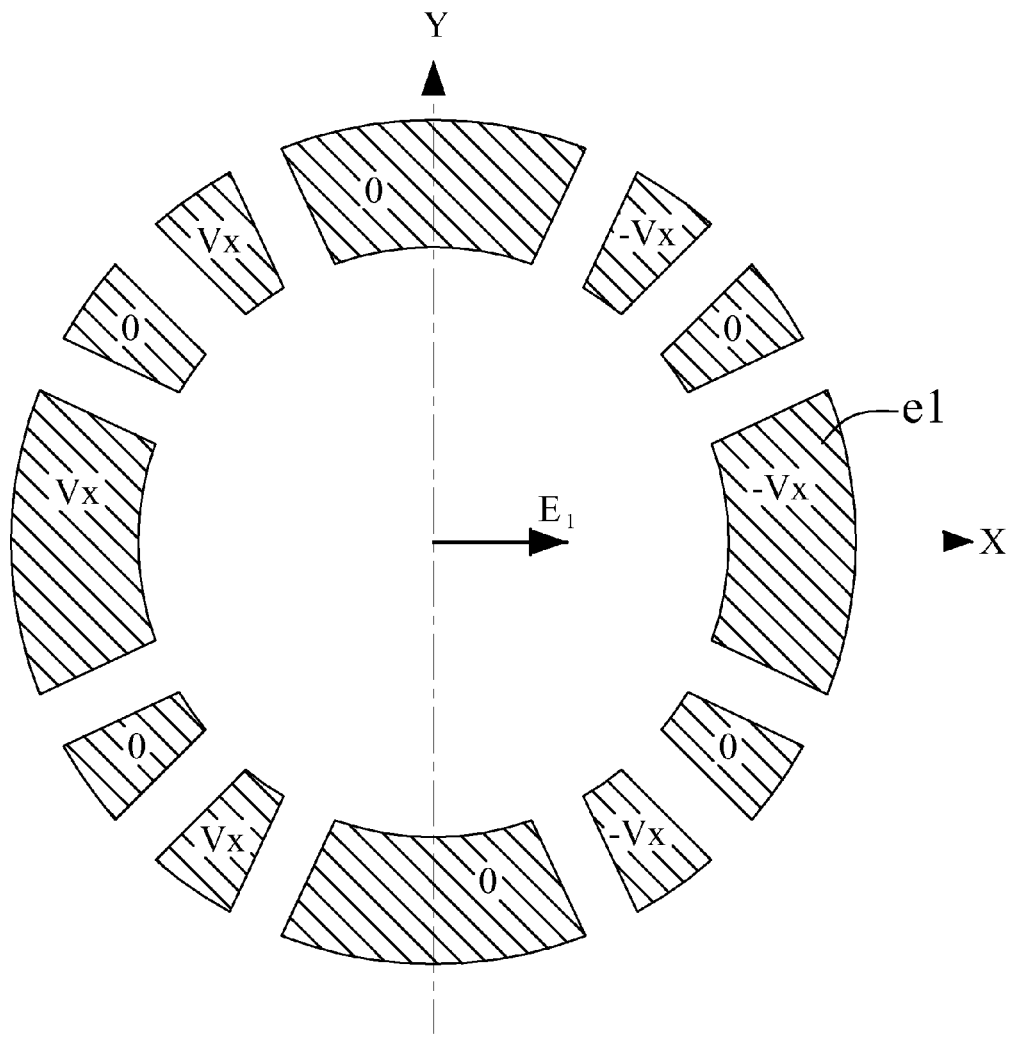
Figure 4E:
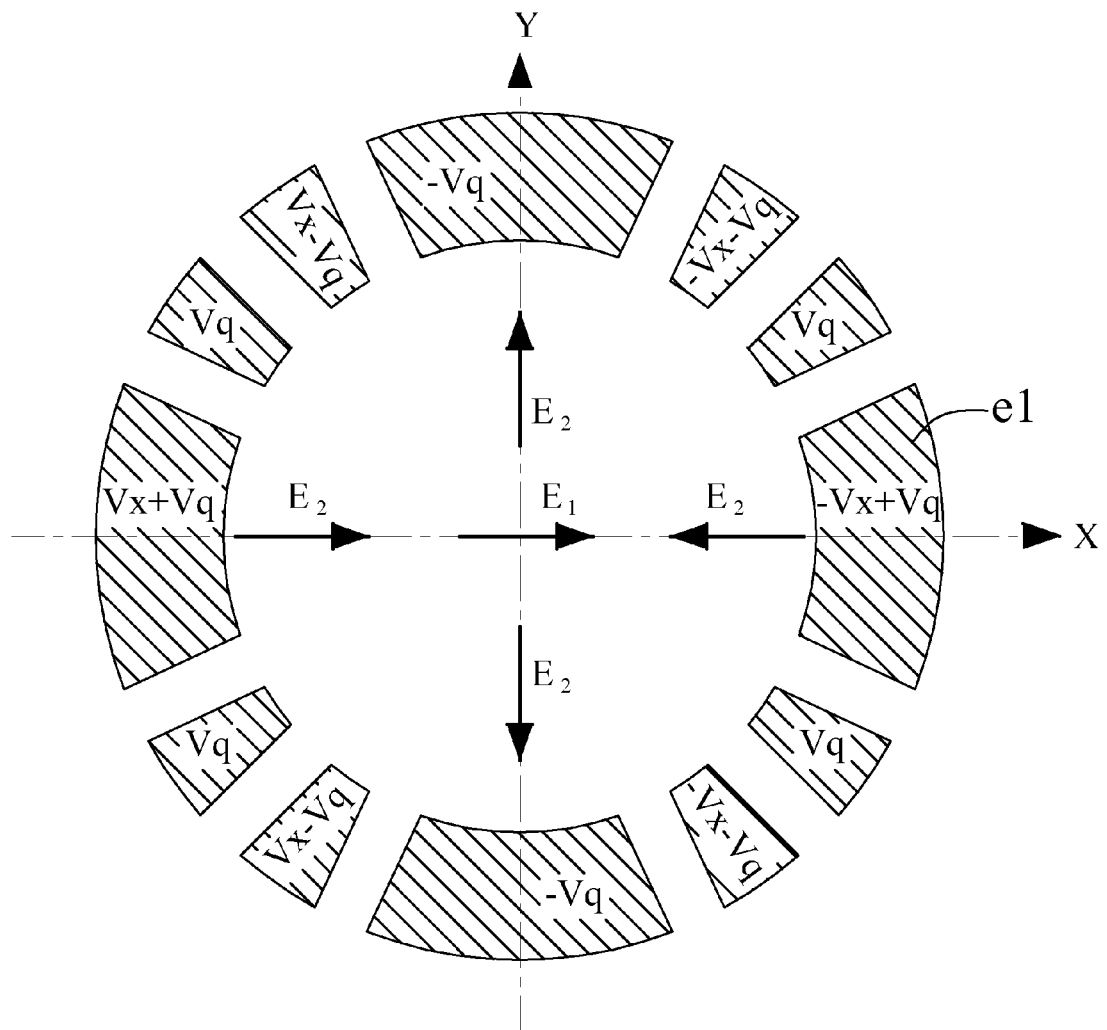
Figure 4F:
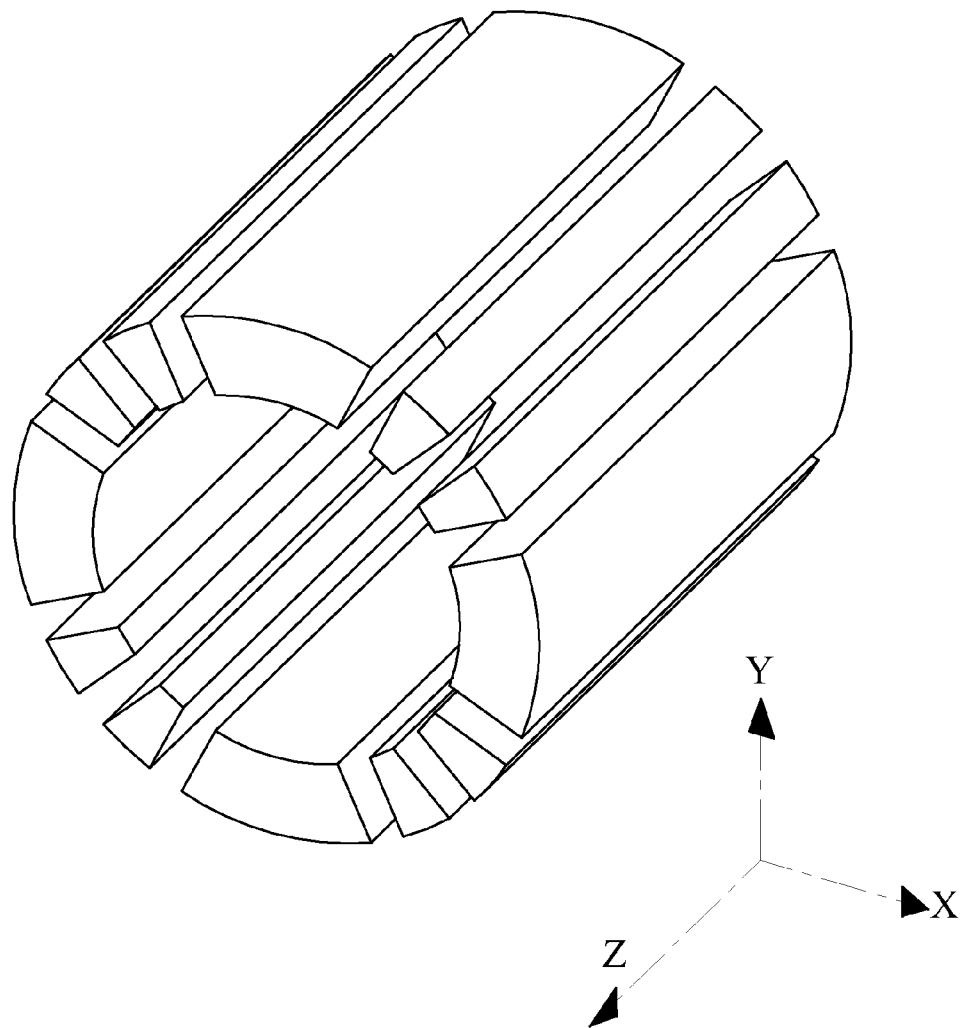
Figure 5A:
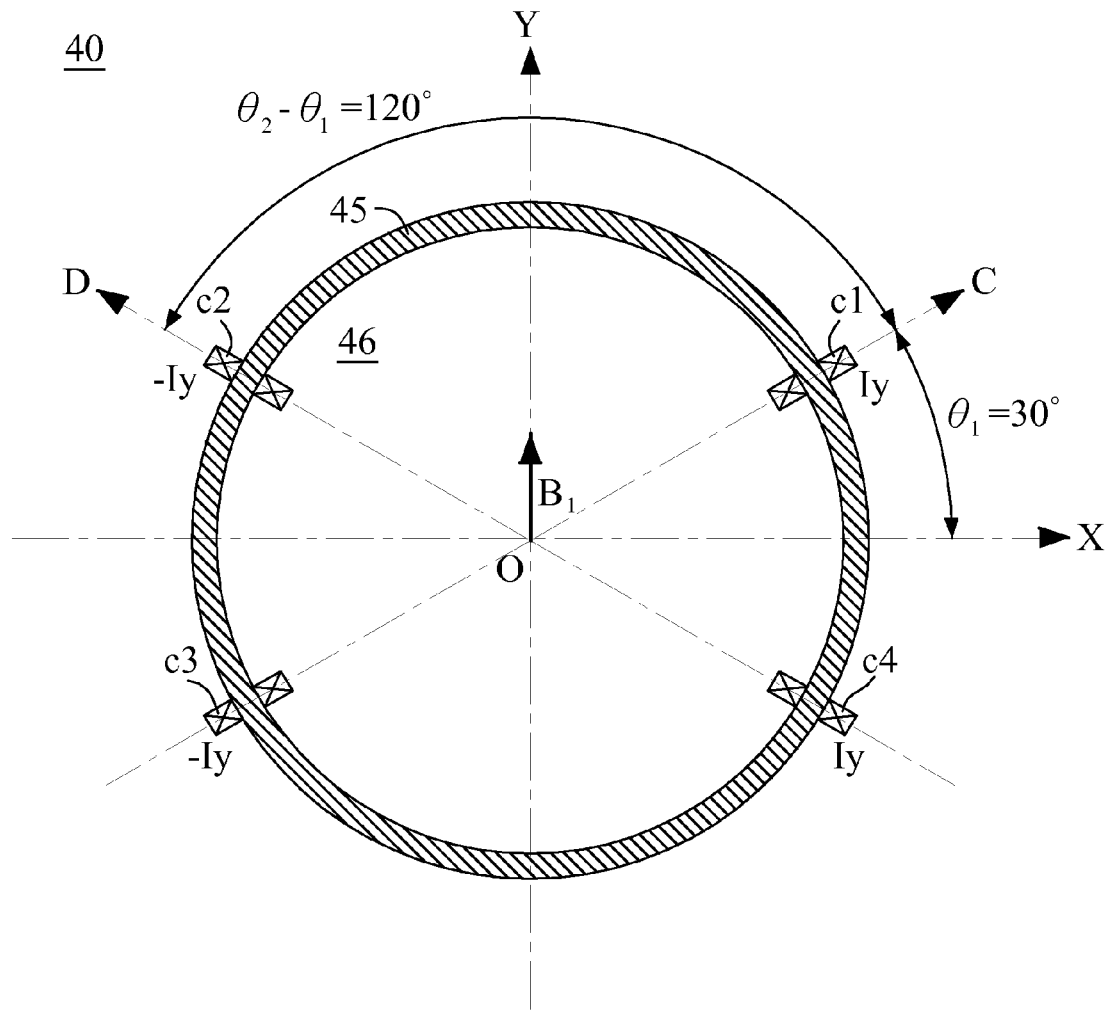
FIGS. 5(a) and 5(b) are schematic illustrations of a cylindrical 4-coil magnetic device and its function in accordance with a second embodiment of the present invention.
Figure 5B:
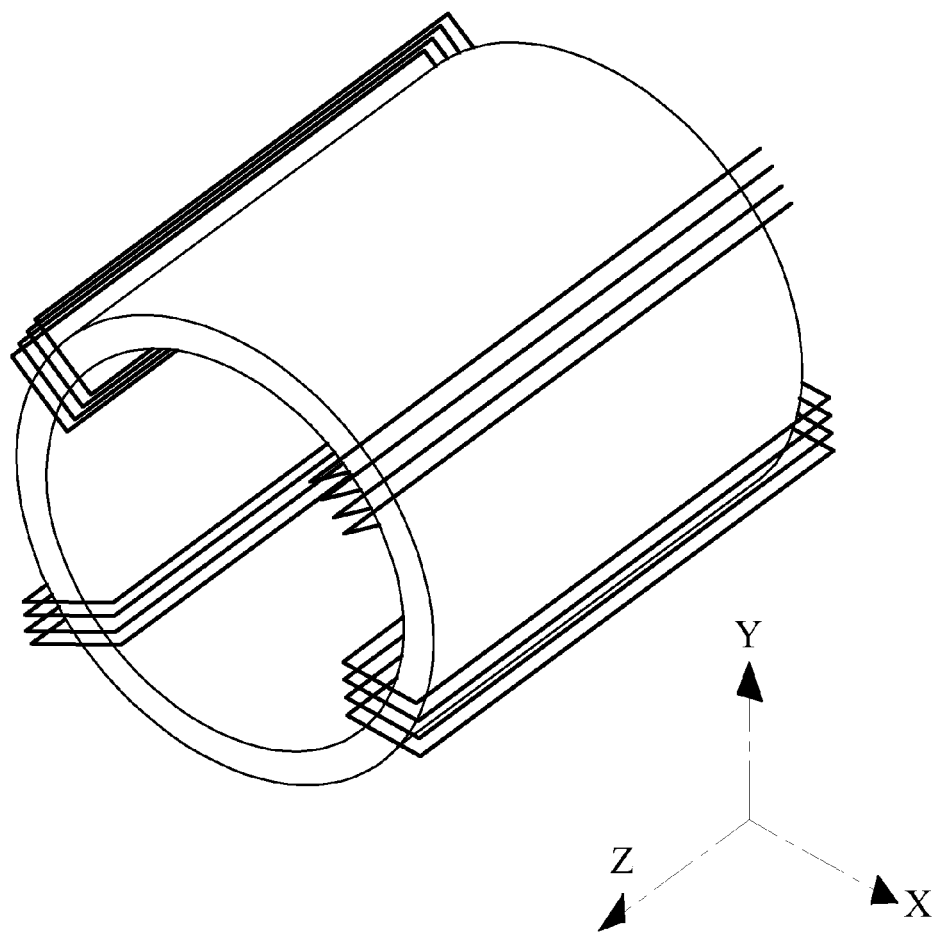

FIG. 4(d) shows a distribution of electric potentials exerted on electrodes e1~e12 to intentionally generate electric dipole field $E_1$ in X direction within the electric device 30. In FIG. 4(d), the electrodes e5, e7 and e9 all are at a first potential which can be equal to a positive potential Vx, the electrodes e1, e3, e11 all are at a second potential which then is equal to the opposite potential −Vx, and all the other electrodes are at the average potential of the first and the second potentials, which is equal to zero potential here. The undesired $3^{rd}$ order field harmonic $E_3$ appears with the dipole field $E_1$, but is suppressed to be negligibly-small. Analogously, if the potential distribution is rotated 90° about Z-axis, the electric dipole field $E_1$ will rotated same angle and hence will be in Y direction. As a corollary, if a potential distribution, which is equal to the addition of the potential distributions respectively for generating dipole fields in X and Y directions, is exerted on the twelve electrodes e1~e12, the electric device can generate a dipole field $E_1$ in any given direction. In this case, twelve electrodes e1~e12 have totally four different potentials; therefore the number of the power supplies is less than that of the electric device with twelve identical electrodes used in U.S. Pat. No. 6,844,548. FIG. 4(e) shows a distribution of electric potentials exerted on electrodes e1~e12 to produce a dipole field E1 and a quadrupole field $E_2$, so that the electric device 30 acts as an electric deflector and an electric stigamtor simultaneously. In FIG. 4(e), on the basis of the potential distribution shown in FIG. 4(d), the potentials of the electrodes e1, e2, e6, e7, e8 and e12 are further increased by a first amount equal to Vq, while the potential of the other electrodes are further reduced by a second amount which is opposite to the first amount and hence equal to −Vq here.

As the second embodiment of the invention, a cylindrical 4-coil magnetic device is proposed and shown in FIGS. 5(a) and 5(b). The magnetic device 40 comprises four coils c1~c4 named in a counterclockwise rotation sequence and a cylindrical magnetic core 45 with a cylindrical through hole 46. The central axis of the through hole 46 coincides with Z-axis and is called as the central axis and optical axis of magnetic device 40. FIG. 5(a) is the view on a sectional plane perpendicular to the optical axis on Z-axis. The coils c1~c4 are respectively winded around the inner sidewall and outer sidewall of the magnetic core 45 in $1^{st}$~$4^{th}$ quadrants, and accordingly named as $1^{st}$~$4^{th}$ coils. The coils c1 and c3 are bisected by the common central plane COZ and the coils c2 and c4 are bisected by the common central plane DOZ, and both of the two common central planes contain the optical axis. The coils c1~c4 form a 4-fold symmetry about the plane XOZ and the plane YOZ. That means the plane XOZ and the plane YOZ respectively bisect two adjacent angles between the common central plane COZ and the common central plane DOZ. The central line of each coil goes through the origin O, and its azimuth with respect to X axis is called as the azimuth θ of the coil and used to express the position thereof. For the sake of clarity, the coil c1 is used to define the orientation of the magnetic device 40 in the following description. The azimuth difference $\theta_1 - \theta_2$ of coils c1 and c2 is preferred between about 110° to 130°, and most preferred equal to 120°. FIG. 5(b) shows the magnetic device 40 in a three-dimensional drawing.

In FIG. 5(a), to intentionally produce a magnetic dipole field $B_1$ in Y direction within the magnetic device 40, the magnetomotive excitations (in ampere-turns) exerted on coils c1~c4 are equal in magnitude, but different in electric current direction. The electric current directions of the coils c1~c4 form a symmetry and an anti-symmetry with respect to the plane XOZ and the plane YOZ respectively. For example, please refer to the outer portions of the coils c1~c4, which are on the outer sidewall of the magnetic core 45, the directions of the currents Iy and −Iy of coils c1 and c2 are opposite to each other, thereby being anti-symmetrical about the plane YOZ, while the current directions of the coils c1 and c4 are same, thereby being symmetrical about the plane XOZ. The undesired $3^{rd}$ order field harmonic $B_3$ appears with the dipole field $B_1$, but is suppressed to be negligibly small. The magnetic field distribution is much more determined by the shape and the permeability of the magnetic core 45 than the shapes of coils c1~c4. Compared with a magnetic deflector without a magnetic core, using a magnetic core can not only get a stronger magnetic field (at least 10 times) without changing the excitations of the coils, but also realize a magnetic field distribution more approaching its designed performance because a magnetic core can be made with higher accuracy than a coil. Therefore the magnetic device 40 can act as a magnetic deflector which can produce a dipole field perpendicular to its optical axis while only incurring a negligibly-small $3^{rd}$ order field harmonic and requiring low magnetomotive excitations.

Figure 6:
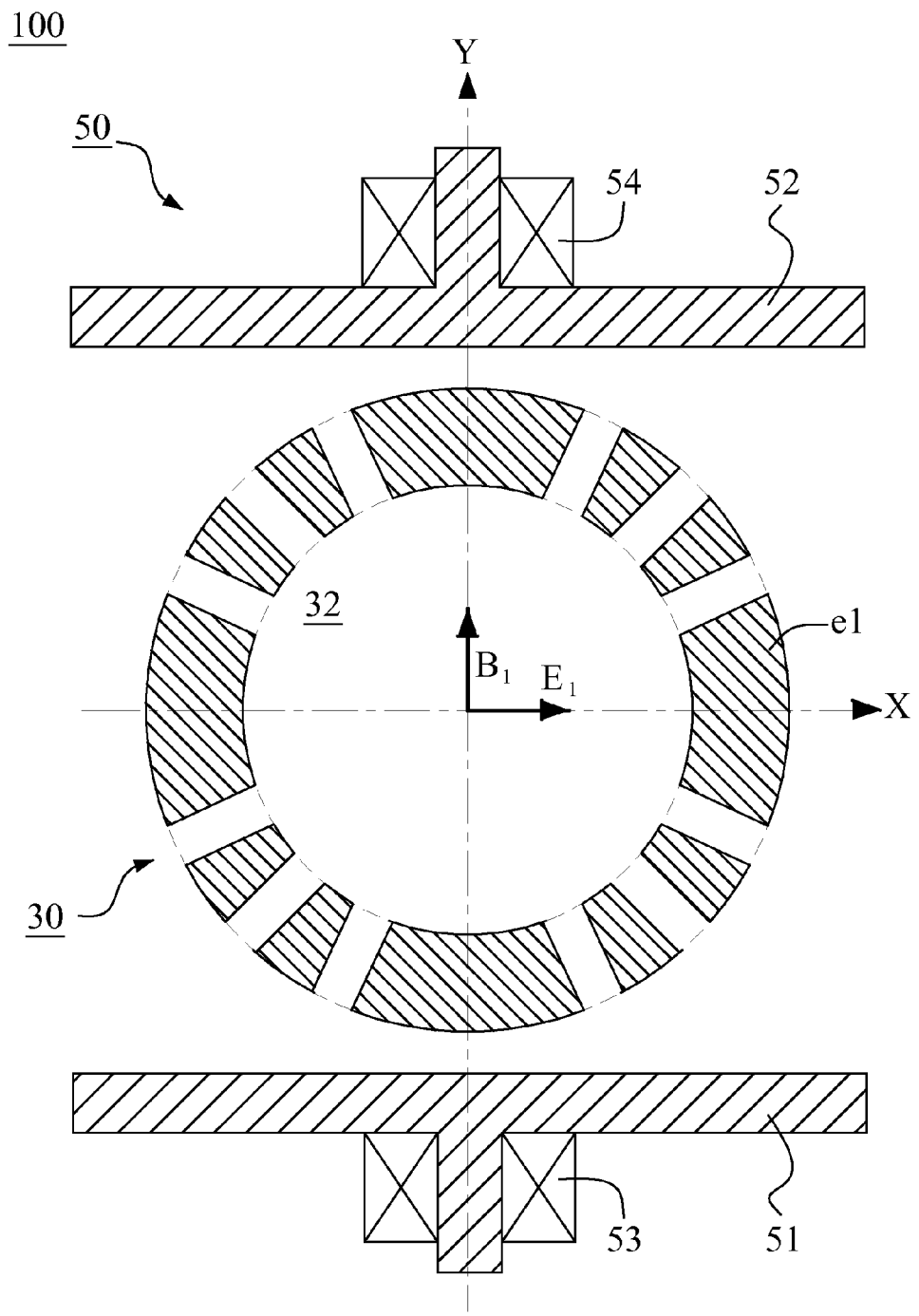
FIG. 6 is a schematic illustration of a Wien Filter in accordance with a third embodiment of the present invention.

In the following drawings, one or both of the first and second embodiments are used to construct a Wien filter. FIG. 6 shows a Wien filter 100 as the third embodiment of the invention in the view on a sectional plane perpendicular to the optical axis thereof. The Wien filter 100 comprises a 12-electrode electric device 30 same as shown in FIGS. 4(a)~4(f) and a conventional magnetic deflector 50. The central axis of the electric device 30 is on Z-axis and called as the optical axis of the Wien filter 100. The $1^{st}$ electrode e1 has a symmetry about the plane XOZ. The outer ends of the twelve electrodes e1~e12 of the electric device 30 are configured to form a cylindrical shape here for the sake of simplicity in drawing, but it can be other shapes. The electric device 30 is excited to generate an electric dipole field $E_1$ in X direction. Furthermore, the astigmatism occurring when Wien filter 100 works, can be compensated by additionally exciting the electric device 30 to generate an electric quadrupole field. The magnetic deflector 50 comprises two electromagnets respectively having a magnetic pole-piece (51, 52) and a coil (53, 54). Two magnetic pole-pieces 51 and 52 sandwich the electric device 30, and are set opposite to each other. Each of magnetic pole-pieces 51 and 52 has a flat front end facing and parallel to the plane XOZ. The two coils 53 and 54 are respectively winded around the back ends of two magnetic pole-pieces 51 and 52. To generate a magnetic dipole field $B_1$ in Y direction, the two coils 53 and 54 are excited in such a way that the north pole of the one electromagnet is directed toward the south pole of the other electromagnet.

Figure 7A:
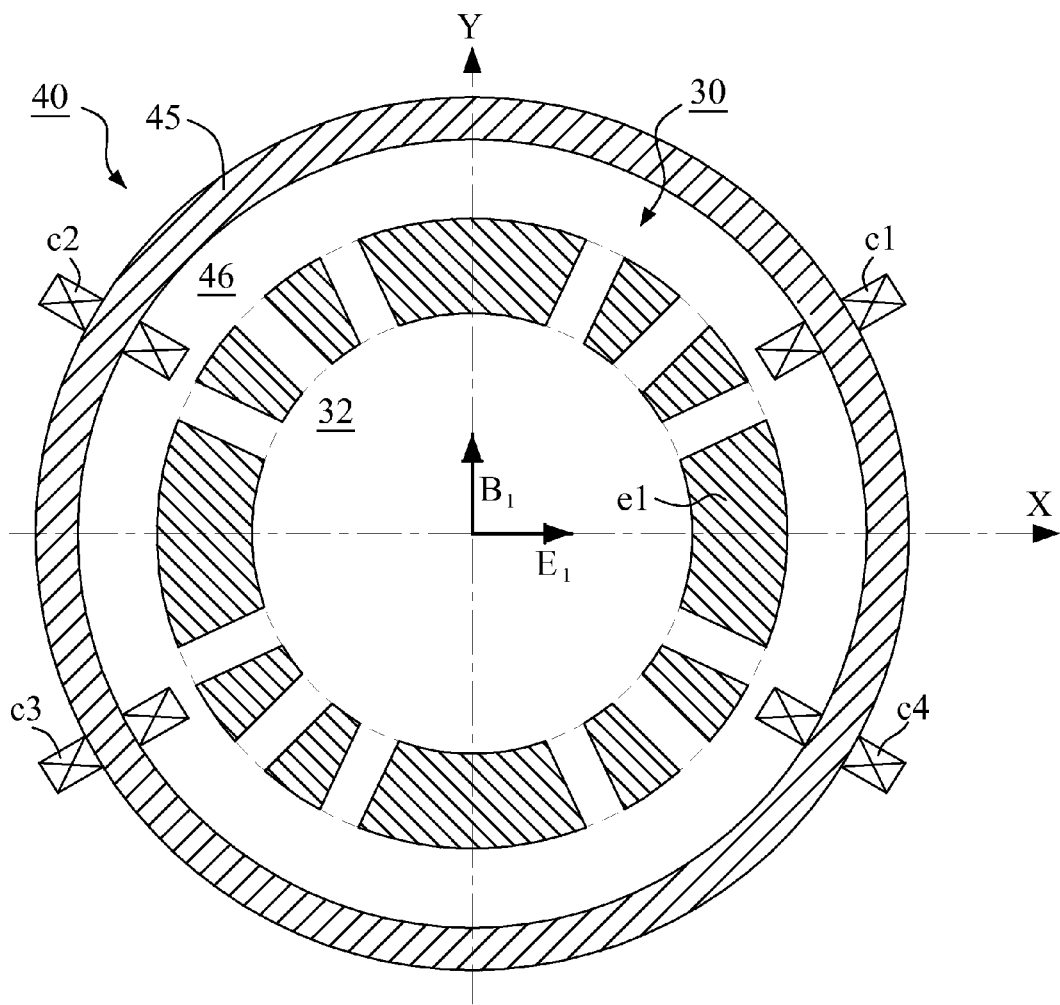
FIGS. 7(a) and 7(b) are schematic illustrations of a Wien Filter in accordance with a fourth embodiment of the present invention.
Figure 7B:
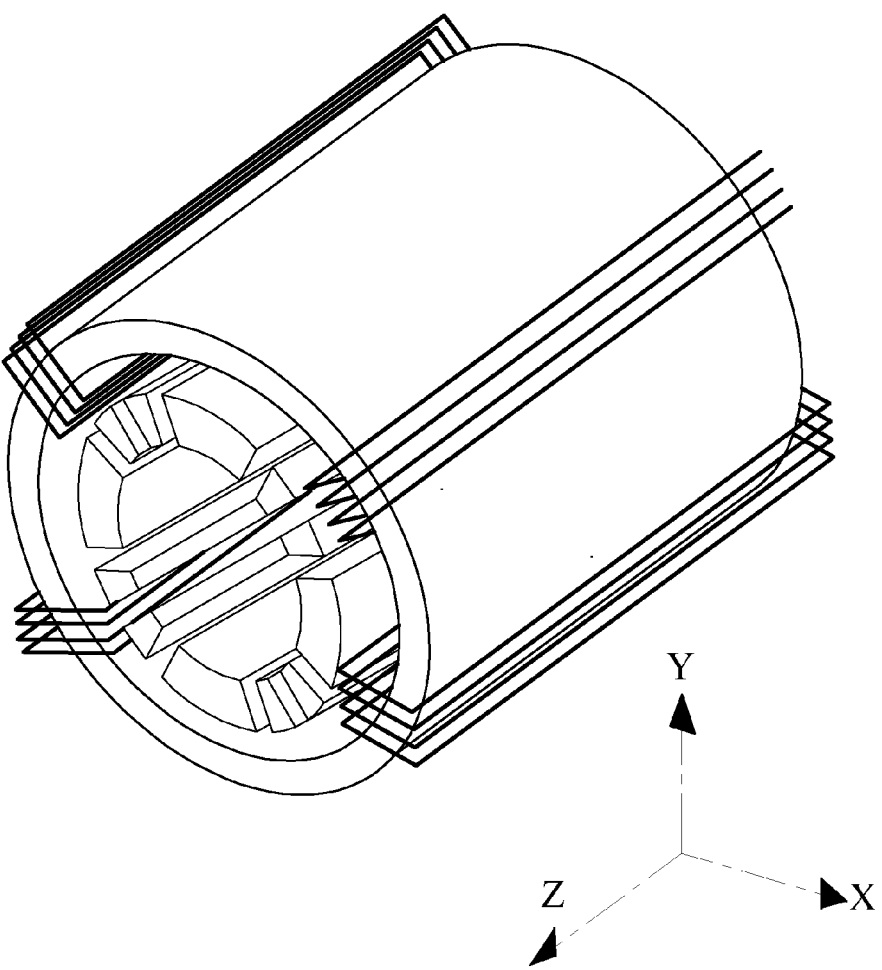

FIGS. 7(a) and 7(b) show a Wien filter 200 as the fourth embodiment of the invention. FIG. 7(a) is the view on a sectional plane perpendicular to the optical axis of the Wien filter 200. The Wien filter 200 comprises a cylindrical 12-electrode electric device same as shown in FIGS. 4(a)~4(f) and a cylindrical 4-coil magnetic device 40 same as shown in FIGS. 5(a) and 5(b). In the electric device 30, the outline thereof is configured to be cylindrical and coaxial with the cylindrical through hole 32 thereof. In the magnetic device 40, the cylindrical through hole 46 thereof is configured to be coaxial with the cylindrical outline of the magnetic core 45. The electric device 30 is inside the cylindrical through hole 46 of the magnetic core 45 of the magnetic device 40, and the central axes of both electric device 30 and the magnetic device 40 coincide and are on Z-axis. The central axis of the electric device 30 is called as the optical axis of the Wien filter 200. The $1^{st}$ electrode e1 of the electric device 30 has a symmetry about the plane XOZ, and the angle between the central plane of the through slit s1 and the plane XOZ is preferred equal to about 25°. The electric device 30 is excited to generate an electric dipole field $E_1$ in X direction. Furthermore, the astigmatism occurring when Wien filter 200 works, can be compensated by additionally exciting the electric device 30 to generate an electric quadrupole field. For the magnetic device 40, the $1^{st}$ coil c1 is so arranged that coils c1 and c2 form a symmetry with respect to the plane YOZ and an angle most preferred equal to about 120°. The magnetic device 40 is excited to generate a magnetic dipole field $B_1$ in Y direction. FIG. 7(b) shows the Wien filter 200 in a three-dimensional drawing.

In FIG. 6 and FIGS. 7(a) and 7(b), the cylinder 31 formed by the electrodes e1~e12 is sandwiched by the magnetic pole-pieces 51 and 52, and surrounded by the magnetic core 45 respectively. Therefore, the distribution shapes of the on-axis electric dipole field $E_1$ and the on-axis magnetic dipole field $B_1$ resemble each other, but the magnetic one will be sharper than the electric one. To satisfy the Wien Condition as more as possible, especially at the both end sides of the Wien filter, a measure is proposed as the fifth embodiment of the invention for making the on-axis electric and magnetic dipole fields $E_1$ and $B_1$ match each other much more in field distribution shape along the optical axis on Z-axis. The design is to weaken the electric fields at the two end portions of the cylinder 31 by increasing the inner diameters thereof.

Figure 8:
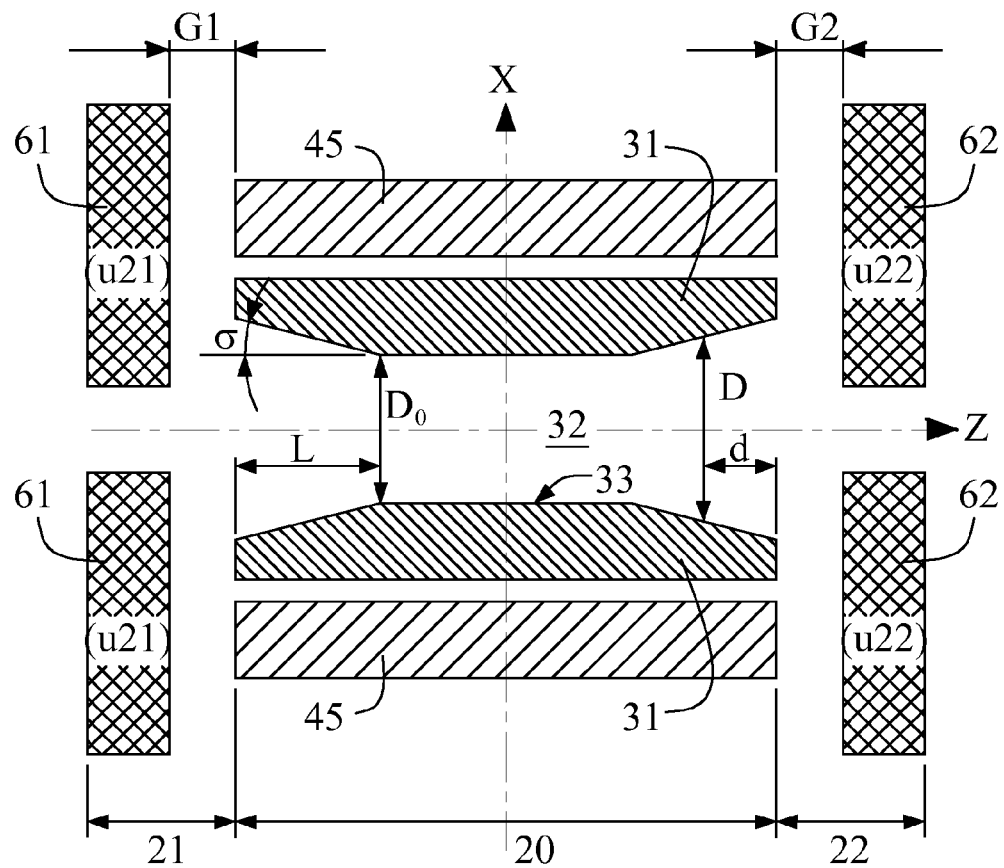
FIG. 8 is a schematic illustration of a Wien Filter in accordance with a fifth embodiment of the present invention.

The Wien filter 200 shown in FIGS. 7(a) and 7(b) is taken as an example to show how the measure is implemented in a Wien filter. For the sake of clarity, the Wien filter 200 shown in FIGS. 7(a) and 7(b) with an addition of the measure is named as Wien filter 300 and shown in FIG. 8. The optical axis of Wien filter 200 is also taken as the optical axis of Wien filter 300 and coincident with on Z-axis. FIG. 8 is the view on the sectional plane on the plane XOZ. At first, two field-terminating plates 61 and 62 are employed to sandwich the electric device 30 and the magnetic device 40 with two axial gaps respectively, wherein G1 and G2 indicate the two axial gaps on two end sides of the magnetic device 40 respectively. The plates 61 and 62 are perpendicular to the optical axis. The field terminating plates 61 and 62 are made of a material of both electric and magnetic conductor, and have a permeability u21 and u22 respectively. For electrons passing through, each of the two plates 61 and 62 has an opening aligned with Z-axis. The two axial gaps G1 and G2 respectively can be filled with a material having permeability much lower than that of the entities forming that gap (such as the field-terminating plate 61 and the magnetic core 45 forming the gap G1) but most preferred vacuum or filled with a material of non-magnetic conductor. Then, the sidewall 33 of the cylindrical through hole 32 formed by twelve electrodes of the electric device 30 is shaped to have two conical end portions which are coaxial with the cylindrical central portion of the hole 32, and can be identical in geometry but opposite to each other.

Within each conical end portion in FIG. 8, the diameter D of the sidewall 33 will decrease with an increase in the axial shift d from the end face, and eventually become equal to the diameter $D_0$ of the center cylindrical portion. The conical angle σ determines the increase rate of the inner diameter D starting from the diameter $D_0$, and hence influences the decrease rate of the magnitude of the electric field $E_1$ to some extent. Although the influence will spread out all over the field distribution area along the optical axis on Z-axis, the most obvious change appears where the conical end portion is located and its axial range is determined by the length L of the conical end portion. As a result, the two conical end portions make the distribution shape of the on-axis electric dipole field $E_1$ sharper at the two near fringe areas 21 and 22 thereof, and hence an appropriate combination of its conical angle σ and length L can make the on-axis electric dipole field $E_1$ more match the on-axis magnetic dipole field $B_1$ in field distribution shape.

Figure 9A:
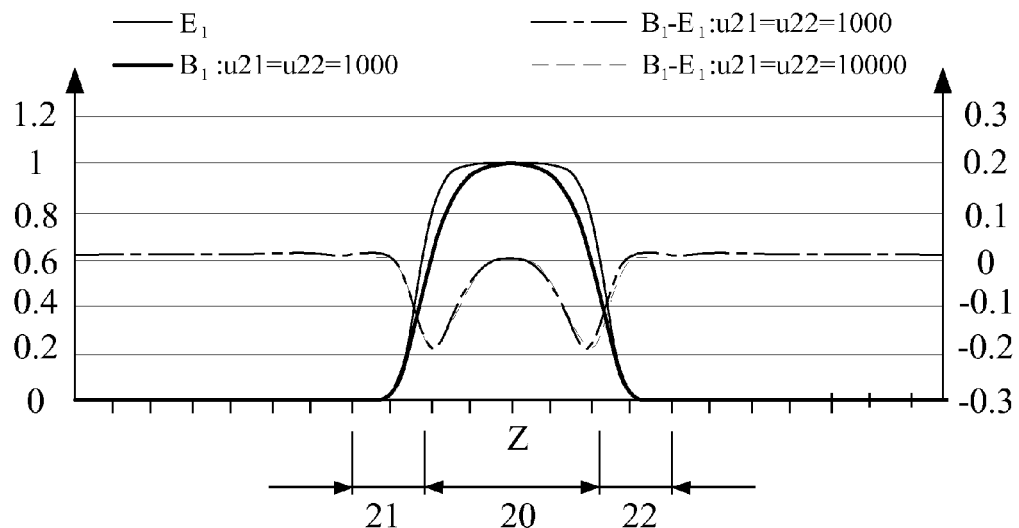
FIGS. 9(a) and 9(b) show an improvement of the fields-match of a Wien Filter in accordance with a fifth embodiment of the present invention.
Figure 9B:
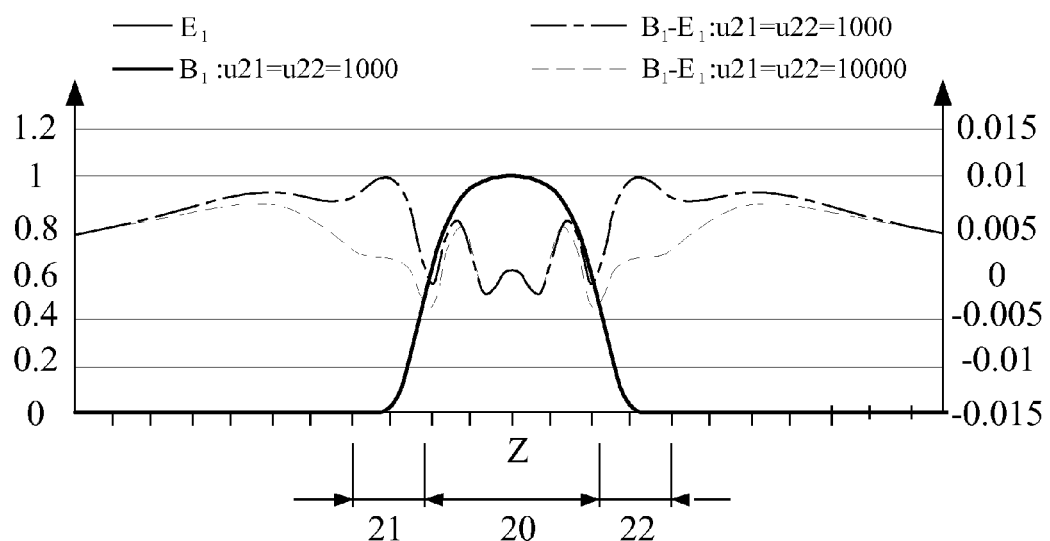

FIG. 9(a) and FIG. 9(b) show the distributions of normalized on-axis electric and magnetic fields $E_1$ and $B_1$ of Wien filter 300 respectively without and with two conical end portions. In FIG. 9(a) the magnetic field $B_1$ in bold solid line drops much earlier than the electric field $E_1$ in slim solid line. The maximum of their differences $B_1 - E_1$ is about 0.2, which appear near the two ends of the main area 20. The larger the field difference $B_1 - E_1$, the less the Wien condition is achieved. Increasing the permeability u21 and u22 of the terminating plates is useless for reducing the field difference within the main area 20, and the reduction of the field difference in the fringe areas 21 and 22 is too small to be seen. As expected, in FIG. 9(b), the electric field $E_1$ in slim solid line is almost same as the magnetic field $B_1$ in bold solid line, and their difference is reduced to be smaller than 0.005 within the main area 20. In this case further increasing the permeability u21 and u22 of the field-terminating plates is effective for reducing the field difference in the near fringe areas 21 and 22.

In this invention, a multi-pole type Wien filter is provided. In each embodiments of the Wien filter, Wien condition is satisfied as much as possible in practice, and hence the Wien filter acts more purely approaching its fundamentally expected performance. At first, a 12-electrode electric device is proposed as an electric deflector only or an electric deflector and an electric stigmator together, which comprises twelve electrodes respectively separated by twelve straight through slits orientated in a special azimuth arrangement. The inner ends of the twelve electrodes form a cylindrical through hole and an 8-fold symmetry. By exciting the twelve electrodes with a special potential distribution which requires fewer power supplies than the prior art, the electric device can generate an electric dipole field in any direction and make the undesired $3^{rd}$ order field harmonic negligibly-small. Secondly, a cylindrical 4-coil magnetic device is proposed as a magnetic deflector, which comprises a cylindrical magnetic core with a cylindrical through hole and four coils that are winded around the magnetic core and orientated in a special azimuth arrangement. The magnetic device can produce a magnetic dipole field in a given direction and almost eliminate the undesired $3^{rd}$ order field harmonic. The employment of the magnetic core not only enhances the field strength but also more preciously regulates the distribution of the magnetic field which is originally generated by the coils. Then two ways to construct a Wien filter respectively with the foregoing electric and magnetic devices, and the foregoing electric device and a conventional magnetic deflector are proposed. In each of such Wien filters, the undesired $3^{rd}$ field harmonics are negligibly small and the astigmatism is compensated by the electric stigmator of the electric device. Furthermore, a measure is proposed for achieving a better match of the on-axis electric and magnetic dipole fields in field distribution shape in such Wien filters, which sharpens the electric field distribution shape by using two conical end portions on the inner sidewall of the electric device.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:
1. An electric device, comprising:
twelve electrodes, inner ends of said twelve electrodes configuring a cylindrical through hole and an 8-fold symmetry, twelve through slits separating the twelve electrodes respectively and parallel to a central axis of said hole, said central axis being an optical axis of the electric device,
wherein each of said twelve through slits has a central plane containing the optical axis,
wherein a $1^{st}$ electrode, a $2^{nd}$ electrode, a $3^{rd}$ electrode, a $4^{th}$ electrode, a $5^{th}$ electrode, a $6^{th}$ electrode, a $7^{th}$ electrode, an $8^{th}$ electrode, a $9^{th}$ electrode, a $10^{th}$ electrode, an $11^{th}$ electrode, and a $12^{th}$ electrode of the twelve electrodes are configured in a rotation sequence,
wherein the 8-fold symmetry has four planes of symmetry, the first and the third planes of symmetry of the four planes of symmetry are perpendicular to each other, the second and the fourth planes of symmetry of the four planes of symmetry are perpendicular to each other, an angle between the first and the second planes of symmetry is 45°, and each of said four planes contains the optical axis, wherein the first plane of symmetry bisects the inner ends of the $1^{st}$ and $7^{th}$ electrodes, the second plane of symmetry bisects the through slit between the $2^{nd}$ and $3^{rd}$ electrodes and the through slit between the $8^{th}$ and $9^{th}$ electrodes, the third plane of symmetry bisects the $4^{th}$ and $10^{th}$ electrodes, the fourth plane of symmetry bisects the through slit between the $5^{th}$ and $6^{th}$ electrodes and the through slit between the $11^{th}$ and $12^{th}$ electrodes, wherein said twelve electrodes are excited to generate an electric dipole field in a direction perpendicular to the optical axis.

2. The electric device according to claim 1, wherein an angle between the first plane of symmetry and the central plane of the through slit between the $1^{st}$ and $2^{nd}$ electrodes is not 15°.

3. The electric device according to claim 1, wherein the angle between the first plane of symmetry and the central plane of the through slit between the $1^{st}$ and $2^{nd}$ electrodes is between about 24° and about 26°.

4. The electric device according to claim 1, wherein inner sides of said twelve through slits, in any sectional plane perpendicular to the optical axis, are geometrically equal to each other.

5. The electric device according to claim 4, wherein each inner side of each of said twelve through slits, in said any sectional plane perpendicular to the optical axis, has an equal arc angle.

6. The electric device according to claim 3, wherein arc angles of inner sides of said twelve through slits, in any sectional plane perpendicular to the optical axis are equal to each other and between about 2° and about 5°.

7. The electric device according to claim 1, wherein
the $5^{th}$, $7^{th}$, and $9^{th}$ electrodes are set at a first potential;
the $1^{st}$, $3^{rd}$, and $11^{th}$ electrodes are set at a second potential;
the $8^{th}$, $10^{th}$, and $12^{th}$ electrodes are set at a third potential; and
the $2^{nd}$, $4^{th}$, and $6^{th}$ electrodes are set at a fourth potential,
an average of the first and second potentials is equal to an average of the third and fourth potentials.

8. The electric device according to claim 7, wherein the average of the first and second potentials is equal to zero potential.

9. The electric device according to claim 7, wherein potentials of the $1^{st}$, $2^{nd}$, $6^{th}$, $7^{th}$, $8^{th}$, and $12^{th}$ electrodes are changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

10. A magnetic device, comprising:
a cylindrical magnetic core with a cylindrical through hole, a central axis of said hole being an optical axis of said magnetic device; and
four coils respectively winding around an inner and an outer sidewalls of said magnetic core and parallel to the optical axis,
wherein a $1^{st}$ coil, a $2^{nd}$ coil, a $3^{rd}$ coil, and a $4^{th}$ coil of said four coils are configured in a rotation sequence, the $1^{st}$ and $3^{rd}$ coils are bisected by a common central plane and the $2^{nd}$ and $4^{th}$ coils are bisected by the other common central plane, and both of the two common central planes contain the optical axis,
wherein a first and a second planes respectively bisect two adjacent angles between the two common central planes, a first and a second directions are both perpendicular to the optical axis and respectively parallel to the first and the second planes, wherein the said four coils are excited to generate a magnetic dipole filed in a direction perpendicular to the optical axis.

11. The magnetic device according to claim 10, wherein the cylindrical through hole is coaxial with an outline of the cylindrical magnetic core.

12. The magnetic device according to claim 11, wherein one of the two adjacent angles between said two common central planes is between about 110° and about 130°.

13. The magnetic device according to claim 12, wherein magnetomotive forces of said four coils are equal in magnitude and the electric current directions thereof are symmetric about the first plane and anti-symmetric about the second plane.

14. A Wien filter, comprising:
an electric device according to claim 1; and
a magnetic device including a first magnetic pole-piece, a second magnetic pole-piece, a first coil, and a second coil, wherein said first magnetic pole-piece and said second magnetic pole-piece include a first flat front end and a second flat front end respectively, the first coil and the second coil wind around rear parts of the first and the second pole-pieces respectively, and the first and the second flat front ends are parallel and opposite to each other and sandwich the electric device,
wherein the optical axis of the electric device is parallel to the first flat front end of the magnetic device, and is an optical axis of the Wien filter,
wherein a first and a second directions of the Wien filter are both perpendicular to the optical axis, and respectively parallel and perpendicular to the first front end of the magnetic device,
wherein the electric device generates an electric dipole field in the first direction,
wherein the magnetic device generates a magnetic dipole field in the second direction by exciting the first and second coils to make the first and second flat front ends have opposite polarities.

15. The Wien filter according to claim 14, wherein the first plane of symmetry of the electric device is parallel to the first direction of the Wien filter.

16. A Wien filter, comprising:
a cylindrical electric device including twelve electrodes, said twelve electrodes configuring a cylinder with a coaxial-cylindrical through hole, a central axis of the through hole being an optical axis of the electric device, said twelve electrodes configuring an 8-fold symmetry and being sectorial in any sectional plane perpendicular to the optical axis, twelve through slits separating said twelve electrodes respectively and parallel to the optical axis, each of said twelve through slits having a central plane containing the optical axis, wherein said twelve electrodes are excited to generate one electric dipole field in a direction perpendicular to the optical axis; and
a magnetic device according to claim 10, wherein the cylindrical magnetic core encompasses the electric device,
wherein the optical axis of the electric device, coincident with the optical axis of the magnetic device, is an optical axis of the Wien filter,
wherein the electric dipole field generated by the electric device is perpendicular to the magnetic dipole field generated by the magnetic device.

17. A Wien filter, comprising:
an electric device according to claim 1, inside the cylindrical through hole of the magnetic core of the magnetic device, wherein the optical axis of the electric device, coincident with the optical axis of the magnetic device, is an optical axis of the Wien filter, the first and the second direction of the magnetic device are a first and a second directions of said Wien filter, wherein the electric device generates an electric dipole field in the first direction of said Wien filter, and the magnetic device generates a magnetic dipole field in the second direction of said Wien filter.

18. The Wien filter according to claim 17, wherein an outline of the electric device is configured to be cylindrical and coaxial with the cylindrical through hole thereof and inner sides of the twelve through slits have equal arc angles in any sectional plane perpendicular to the optical axis, and an outline of the cylindrical magnetic core of the magnetic device and the cylindrical through hole thereof are configured coaxial.

19. The Wien filter according to claim 18, wherein the first plane of symmetry in the electric device coincides with the first plane of the magnetic device.

20. The Wien filter according to claim 19, wherein the $5^{th}$, $7^{th}$, and $9^{th}$ electrodes are set at a first potential;

the $1^{st}$, $3^{rd}$, and $11^{th}$ electrodes are set at a second potential;

the $8^{th}$, $10^{th}$, $12^{th}$, $2^{nd}$, $4^{th}$, and $6^{th}$ electrodes are set at an average of the first and second potentials, wherein the average of the first and second potentials is equal to zero potential, wherein potentials of the $1^{st}$, $2^{nd}$, $6^{th}$, $7^{th}$, $8^{th}$, and $12^{th}$ electrodes are changed by a first amount, and potentials of the $3^{rd}$, $4^{th}$, $5^{th}$, $9^{th}$, $10^{th}$, and $11^{th}$ electrodes are changed by a second amount opposite to the first amount, such that an electric quadrupole field can be generated and superimposed onto the electric dipole field.

21. The Wien filter according to claim 20, wherein each of two end portions of the cylindrical through hole of the electric device has a conical shape coaxial with a cylindrical central portion of said through hole, such that a distribution shape of the electric dipole field can match a distribution shape of the magnetic dipole field along the optical axis of the Wien filter.

22. The Wien filter according to claim 21, further comprising two field-terminating plates being perpendicular to the optical axis of the Wien filter and sandwiching the magnetic device and the electric device with two axial gaps respectively, such that the electric dipole field and the magnetic dipole field along the optical axis of the Wien filter vanish away rapidly outside the Wien filter, wherein each of the two plates is made of a material of both electric and magnetic conductor, has an opening aligned with the optical axis of the Wien filter and for particles passing through, and is set at an average potential of the first and second potentials.

23. The Wien filter according to claim 22, wherein for the electric device, the angle between the first plane of symmetry and the central plane of the through slit between the $1^{st}$ and $2^{nd}$ electrodes is about 25°, arc angles of inner sides of the twelve through slits are equal to each other and between about 2° and about 5° in said any sectional plane perpendicular to the optical axis, and for the magnetic device, the angle between the two common central planes and bisected by the second plane is about 120°.

24. A Wien filter, comprising:

a cylindrical magnetic device including:

a cylindrical magnetic core with a first coaxial-cylindrical through hole, a central axis of the coaxial-cylindrical through hole being an optical axis of said magnetic device and the Wien filter; and four coils respectively winding around an inner and an outer sidewalls of said magnetic core and parallel to the optical axis, said four coils configuring a 4-fold symmetry in any sectional plane perpendicular to the optical axis such that a magnetic dipole field can be generated within the magnetic device in a direction perpendicular to the optical axis; and a cylindrical electric device including twelve electrodes, said twelve electrodes configuring a cylinder with a second coaxial-cylindrical through hole and being inside the first through hole of the magnetic core of the cylindrical magnetic device, a central axis of the second coaxial-cylindrical through hole being an optical axis of the electric device and coincident with the optical axis of the Wien filter, said twelve electrodes configuring an 8-fold symmetry and being sectorial in any sectional plane perpendicular to the optical axis, twelve through slits separating said twelve electrodes respectively and parallel to the optical axis of the electric device, each of said twelve through slits having a central plane containing the optical axis of the electric device, wherein said twelve electrodes are excited to generate one electric dipole field within the electric device in a direction perpendicular to the optical axis of the Wien filter and the magnetic dipole field, wherein each of two end portions of the second coaxial-cylindrical through hole of the electric device has a conical shape coaxial with a cylindrical central portion of said hole, such that a distribution shape of the electric dipole field can match a distribution shape of the magnetic dipole field along the optical axis of the Wien filter.

25. The Wien filter according to claim 24, further comprising two field-terminating plates perpendicular to the optical axis and sandwiching the magnetic device and the electric device with two axial gaps respectively, such that the electric dipole field and the magnetic dipole field along the optical axis of the Wien filter vanish away rapidly outside the Wien filter, wherein each of the two plates has an opening aligned with the optical axis of the Wien filter and for particles passing through, and is made of a material of both electric and magnetic conductor.

26. A Wien filter, comprising:

a magnetic device according to claim 10, inside the cylindrical through hole of the magnetic core of the magnetic device, wherein the optical axis of the electric device, coincident with the optical axis of the magnetic device, is an optical axis of the Wien filter, the first and the second direction of the magnetic device are a first and a second directions of said Wien filter, wherein the electric device generates an electric dipole field in the first direction of said Wien filter, and the magnetic device generates a magnetic dipole field in the second direction of said Wien filter.

* * * * *